United States Patent [19]

Marzan

[11] Patent Number: 4,707,656
[45] Date of Patent: Nov. 17, 1987

[54] CIRCUIT TEST FIXTURE

[76] Inventor: Jose M. Marzan, 7860 Texhoma, Northridge, Calif. 91325

[21] Appl. No.: 712,803

[22] Filed: Mar. 18, 1985

[51] Int. Cl.[4] .............................................. G01R 31/02
[52] U.S. Cl. .............................. 324/158 F; 324/158 P; 324/73 PC
[58] Field of Search ........... 324/158 F, 158 P, 73 PC, 324/72.5, 64

[56] References Cited

U.S. PATENT DOCUMENTS

| 1,045,984 | 12/1912 | King | 254/104 X |
| 2,566,681 | 6/1951 | Davis et al. | 373/126 R X |
| 3,408,565 | 10/1968 | Frick et al. | 324/158 F |
| 3,590,377 | 6/1971 | Sorger | 324/158 F |
| 3,676,775 | 7/1972 | Dupnock et al. | 324/64 |
| 3,775,644 | 11/1973 | Cotner et al. | 324/158 F |
| 4,365,195 | 12/1982 | Stegens | 324/158 F |

OTHER PUBLICATIONS

Moghe et al., "General-Purpose 2-to 12-GHzMMIC Amplifier Nears Production," MSN: 3/84, p. 129.
"Transistor Test Fixture Provides Accuracy to Eighteen GHx," MSN: Sep. (1982), p. 47.
"Three Firm Collaboration Yields New 'Standard' Test Fixture," Microwaves, Aug. 1982, p. 19.
"Transistor Test Fixture (TTF)," Maury Microwave product sheet, Jan. 1983.

Primary Examiner—Reinhard J. Eisenzopf
Assistant Examiner—Vinh P. Nguyen
Attorney, Agent, or Firm—Poms, Smith, Lande & Rose

[57] ABSTRACT

A test apparatus has a fixture with upstanding walls and a receiving slot for receiving a substrate holder with a substrate mounted on the holder. Two launchers extend into the receiving slot. Each launcher has two outside contacts and a center pin contact. The pin is electrically insulated from the outside contacts. The center pins contact the two sides of the narrow, central transmission line contact of the substrate, and the two outside contacts of each launcher contact the wider grounded region on the sides of the narrow active region of the substrate. The outside contacts are mounted on a coplanar sleeve that can rotate to some degree so that when the substrate contacts the outside contacts, the coplanar sleeve can rotate so that the surfaces of the electrical contacts against the substrate conform to the surface of the substrate. The holder has two portions. A guide forces the holder to be inserted into the receiving slot such that the substrate does not contact the launcher. The bottom portion of the holder wedges the part of the holder that holds the substrate upward when the holder is fully inserted into the receiving slot so that the substrate moves vertically upward against the launchers. A bias block may also be provided, and DC source inputs extend through the bias block to the plane of the substrate to make contact with portions of the substrate. A hole may also extend through the bias block to provide access to the receiving access.

9 Claims, 11 Drawing Figures

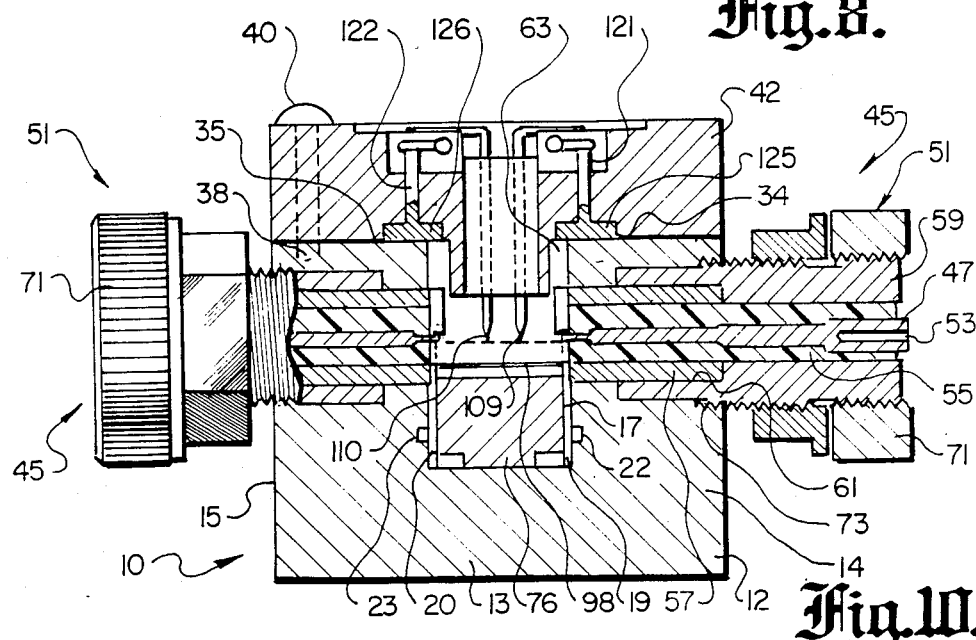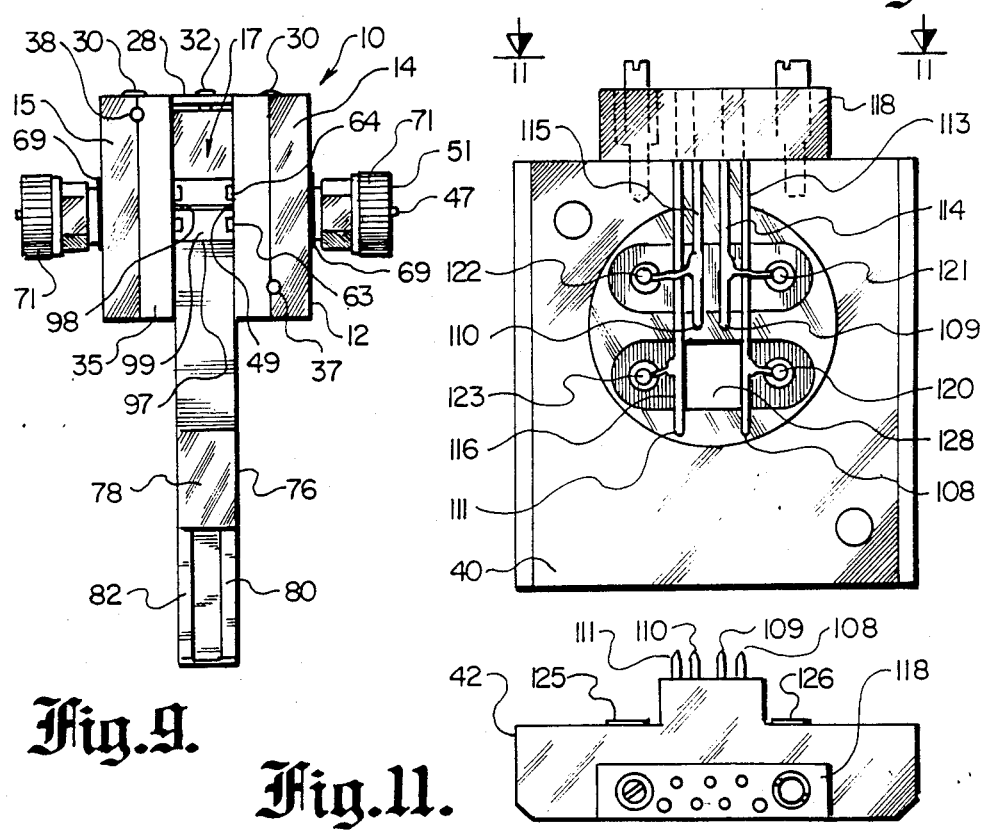

CIRCUIT TEST FIXTURE

BACKGROUND OF THE INVENTION

1. Field of the Invention:

The present invention relates to electronic test fixtures in general and in particular to a fixture for testing different microwave circuitry.

2. Description of The Prior Art:

Monolithic microwave circuits are the subject of much current interest. Coaxial cable is used for signal transmission to and from the circuit, but the circuit itself is generally carried on a planar substrate. Therefore, any test fixture, which holds the substrate while it is being tested, must accommodate these mechanical constraints.

The part of the fixture that interfaces input/output electrical signals between external coaxial transmission line components and the planar type component (e.g. coplanar waveguide or microstrip transmission line) on a carrier substrate within the fixture is known as a coaxial launcher. The substrate contains standard etched gold conductor patterns. The transmission line conductor on the substrate is usually very narrow, from 0.025" to 0.010" (0.6 mm to 0.25 mm). The center contact of the launcher, which also must be very narrow and is usually the same diameter, makes contact with the transmission line conductor of the substrate. Side contacts of the launcher, which are insulated or otherwise spaced from the center contact, make electrical ground contact with the substrate at regions spaced from the central transmission line conductor of the substrate. These outside or grounding contacts must make secure electrical contact, but if the substrate is not perfectly flat, proper electrical contact on both sides of the central region of the substrate is not made.

It is most important that each time the substrate is placed in the fixture the center contact of the launcher only touches the transmission line conductor of the substrate and the outside contact only touch the substrate at locations spaced from the central transmission line conductor. The gap between the transmission line conductor and the spaced grounding regions is no greater than 0.01" (0.25 mm).

In prior art fixtures, the central conductive portion of the launcher, which is of a small diameter, can be broken off relatively easily. Launchers, which are typically gold plated brass and must be machined to relatively close tolerances, are expensive to replace. Also, prior art fixtures are complicated in construction, and it requires much labor and cost to replace the launcher.

Prior art fixtures require the substrate to be mounted within a closed cavity. This prevents access to the device during testing and makes it difficult to see the device or adjust active or passive circuit elements. Moreover, testing of packaged devices is limited by the types of packaging available. Thus, different fixtures have to be made to accommodate different packaged devices.

SUMMARY OF THE INVENTION

It is an object of the present invention to disclose and provide a low cost test fixture which overcomes many of the problems associated with prior art devices. A particular object of the present invention is to have the outer, grounding contacts positively engage the proper locations of the substrate even though the substrate may not be flat. The present invention is designed to be self-aligning.

Another object of the present invention is to permit quick changing of the substrate containing the transistor or other electrical elements to be measured. The prior art used screws, solder connections, pins and other connecting means to mount the substrate within the fixture. It is an object of the present invention to eliminate these added parts so that one can quickly change the substrate.

Another object of the present invention is to disclose and provide a microwave circuit test fixture which prevents the launcher from being damaged by improper insertion of the substrate into the holder. Another object is to disclose and provide a test fixture with reproduceable results in which the substrate can be inserted and removed easily from the fixture. Another object is to insure that each time the substrate holder is inserted into the fixture, proper regions of the substrate are engaged by the proper launcher contacts without having to align the substrate holder or the substrate in the fixture manually. Other objects will be evident from the detailed description from the preferred embodiment.

The stated objects as well as any other objects are met by the present invention which includes fixture means, which has upstanding walls that define a central receiving slot for receiving a substrate holder. A substrate is mounted exposed on an upper surface of the substrate holder. Launcher means in the fixture extend into each side of the receiving slot for making electrical contact at a center location and two outside locations on each side of the substrate. Launcher mounting means in the fixture mount outer grounding contacts of each launcher for rotation about an axis parallel to the plane of the substrate so that the various portions of each launcher can make positive electrical contact with the substrate.

The substrate holder is designed to move the substrate into the receiving slot at a low position away from the launcher. A guide in the receiving slot, which receives a pin on the holder, keeps the holder at the lower position. The holder has two pieces mounted together on sliding inclined surfaces. When the holder is inserted fully into the slot, one piece of the holder is moved relative to the other, and the upper part of the holder moves upward on the inclinded surfaces toward the launcher. The guide in the slot permits the upward movement only when the guide is fully inserted in the slot. No horizontal movement occurs as the holder moves the substrate up to the launchers so there is no potentially damaging movement of the substrate along the launchers.

The outer grounding contact of the launcher is mounted on a sleeve that is free to rotate about the central pin portion of the launcher so that the grounding contact of the launcher can pivot to some degree to accommodate substrates that are not flat. Each launcher is connected to a fixture to which coaxial cable can be connected.

Probes for biasing circuit elements mounted on the substrate extend downward into the receiving slot from a removeable bias block which covers the receiving slot. Because the substrate only moves vertically toward these probes when the holder is properly positioned, the probes do not move along the substrate and will not damage it. The probes extend into the bias block to leads to an electrical connector. The bias block has a central opening which allows one to see and make contact with the substrate during testing.

BRIEF DESCRIPTION OF THE DRAWINGS

There are eleven figures, FIGS. 1-7 are on sheet 1, and FIGS. 8-11 are on sheet 2.

FIG. 1 is a perspective view of the test apparatus of the present invention showing the substrate holder inserted into the test fixture.

FIG. 2 is a end view of the contacts of the launcher used in the fixture of the present invention.

FIG. 3 is a sectional view of the test apparatus of the present invention taken through plane 3—3 of FIG. 1 and shows the holder inserted into the fixture. The holder is in its lower position.

FIG. 4 is similar to FIG. 3, but the bias block of the test apparatus and the substrate holder have been removed.

FIG. 5 is a sectional view of the substrate holder taken through plane 5—5 of FIG. 3.

FIGS. 6 and 7 are side views of the substrate holder showing movement of parts of the holder between two different positions.

FIG. 8 is a sectional view taken through plane 8—8 in FIG. 1 of the test apparatus of the present invention.

FIG. 9 is a top view of the test apparatus of the present invention with the bias block removed.

FIG. 10 is a top view of the bias block of the test apparatus of the present invention.

FIG. 11 is an end view of the bias block of the test apparatus of the present invention and is taken through plane 11—11 in FIG. 10.

DETAILED DESCRIPTION OF THE PREFERRED EMBODIMENT

Figures 3, 4:
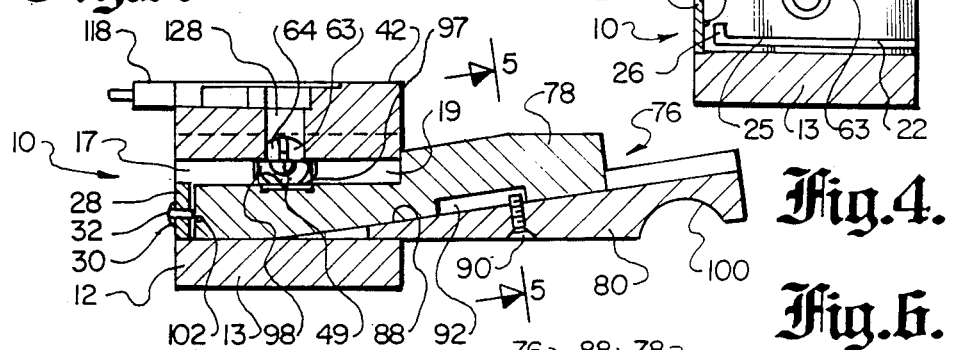
Figures 5, 7:
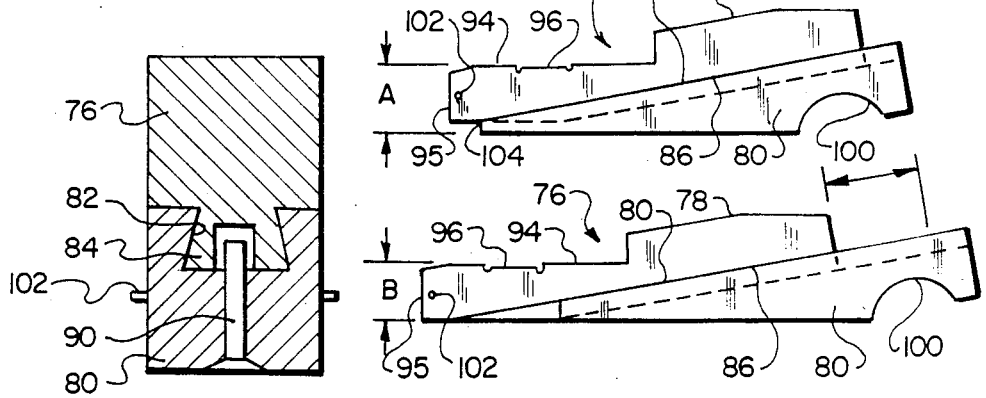

1. The Frame. The test apparatus of the present invention comprises fixture means 10 (FIGS. 1, 3, 8 and 9), which includes a main frame member 12 formed of aluminum. Main frame 12 has a base portion 13 and two upstanding side walls 14 and 15. Between side wall 14 and 15 is a central receiving slot 17 (FIGS. 1, 3, 8 and 9). Inside surfaces 19 and 20 of side walls 14 and 15 (FIGS. 3, 4 and 8), which are parallel to each other, have guide slots 22 and 23 (FIGS. 4 and 8). The purpose of the guide slots is discussed in more detail below, but each has a generally horizontal section 25 (FIG. 4) extending most of the width of the wall 19 surface and has a short upturned portion 26.

A short backwall 28 (FIGS. 3, 4 and 9) closes the bottom portion of one end of receiving slot 17. Backwall 28 is attached by small screws 30 to a recess in the ends of upstanding walls 19 and 20. Backwall 28 receives an adjustable stop member 32, which is described in more detail below.

The top surface of upstanding walls 14 and 15 each have a thin conductive strip 34 and 35 (FIG. 9) for making electrical contact with one end of an RF filter on the bias block. The other end of the filter is attached to the bias probes, as explained in more detail in Part 4. Tapped openings 37 and 38 (FIG. 9), which extend partially through strips 34 and 35, receives screws 40 that hold bias block 42 (FIGS. 1, 8, 10 and 11) in place.

2. The Launcher. Launcher means in the fixture means extends into the receiving slot for making electrical contact at a center location and two outside locations on the substrate. The launcher configuration is determined part by the frequency characteristics of the circuit. Higher frequency circuits require smaller parts. The frequency also effects the type of coaxial cable used to connect to the fixture, and the launcher is designed to accommodate the fixture. The launcher shown in the exemplary embodiment is designed for measurements in the 45 MHz to 18.0 GHz frequency range and connects to a 7.0 mm coaxial line.

Launcher or coaxial connector 45 in the exemplary embodiment (FIG. 8 and partially in FIGS. 1, 2, 3, 4 and 9) includes a central pin 47, which has a narrow diameter end 49 (FIGS. 2, 3, 4, 8 and 9) that extends a short distance into receiving slot 17 (FIGS. 8 and 9). Narrow end 49 is semicircular in cross-section (FIGS. 2-4), and the flat portion faces downward. Pin 47 tapers in steps to a wider diameter, and it extends through upright walls 14 and 15 and through coaxial fitting 51. Steps gradually change the discontinuity from the wider coaxial input to the narrow end of the pin to the transmission line conductor on the substrate, (e.g. 0.025" in diameter). The steps maintain a matched impedance, normally 50$\Omega$, with the coaxial input. Fitting 51 is standard for 50$\Omega$ coaxial line. The central connector of the coaxial line extends into opening 53 in the outside end of pin 47.

Insulating member 55 supports and spaces pin 47 from metal coplanar sleeve 57 and connector body 59. The insulation is shown extending around all of pin 47 except for the portion of narrow end 49 that projects into receiving slot 17. Insulation 55 does not have to surround all of pin 47. For example, the insulation could be between the wider diameter portion of pin 47 and connector body 59, but only air would separate the narrow end of pin 47 from coplanar sleeve 57. A short section of insulation could be mounted at the outside end of pin 47, and another short section of insulation could be mounted around the other end of the pin. Some of these design choices will vary depending on the shape of the pin and the connector body which in turn will depend on the frequency range of the circuit. Because of different dielectric constants for different materials (e.g. air versus Rexolite, a common dielectric), the steps of the various launcher parts may be changed to maintain a matched 50$\Omega$ impedance.

Connector body 59 has an annular recess 61, which receives coplanar sleeve 57 (FIG. 8). As an alternative the rear end of coplanar sleeve 57 could butt up against the front of connector body 59. Coplanar sleeve extends into receiving slot 17 (FIG. 8) in that two pie-shaped wedges 63 and 64 (FIG. 2) extend partially into the receiving slot. Each wedge 63 and 64 has a horizontal bottom surface 66 and 67 respectively, which is approximately parallel with the bottom surface 50 of pin 47. Actually, bottom surface 50 may be slightly below surfaces 66 and 67 so that pin 49 moves upward slightly when pushed by the substrate until surfaces 66 and 67 engage the substrate so that pin 47 is biased downward against the substrate.

The mounting between coplanar sleeve 57 and connector body 59 (and possibly insulation 55) (FIG. 8) is such that coplanar sleeve 57 can rotate. When the substrate makes contact with surfaces 66 and 67 of coplanar sleeve 57 and with pin 47 in a manner discussed below, surfaces 66 and 67 should be flat on the substrate at the desired location. Substrates may be slightly warped, or they may be mounted in the holder such that they are not perfectly flat. Rotation of coplanar sleeve 57 compensates for any irregularities. A pin (not shown), perpendicular to the axis of rotation of coplanar sleeve 57 seats in an annular groove in the outside of sleeve 57 to position the sleeve and permit it to rotate. Anchor plates 69 (FIG. 9) secure coaxial fittings 51 to the outside of main frame 12. Coaxial fitting 51 also has a rotating nut 71 for being attached to a corresponding fitting on the coaxial fitting. In place of attaching plates 69, the outside of connector body 59 can be threaded as at 73 (FIG. 8) to hold the connector body to the main frame.

3. The Substrate Holder. The present invention includes a holder mountable within the receiving slot for positioning the substrate against the launcher. In the exemplary embodiment, holder 76 is of about the same width as receiving slot 17 (FIGS. 1 and 8) into which holder 76 is designed to be inserted. Holder 76 has a top member 76 attached to a bottom member 80 (FIGS. 3-7). In the exemplary embodiment, bottom member 80 has a keyway 82 (FIG. 5) in which is received tapered projection 84. The bottom surface 86 of top member 78 and the top surface 88 of bottom member 80 are inclined (FIGS. 3, 6 and 7), and they slide relative to each other.

A screw 90 (FIGS. 3 and 5) extends through bottom member 80 into slot 92 in the bottom of top member 78. Screw 90 limits the travel between the top and bottom members. Keyway 82 and the tapered projection 84 hold the top and bottom members 78 and 80 together. The top surface 94 of upper member 78 has a thin recess 96 approximately the thickness of substrate 97, and the substrate is received in the recess (FIG. 3). Bottom member 80 also has a semicircular indentation 100, which allows one to grip bottom member 80 more easily.

A short pin 102 (FIGS. 3, 5, 6 and 7) extends horizontally through upper member 78. When holder 76 is inserted into receiving slot 17, pin 102 blocks insertion unless the pin is properly located in slots 22 and 23 (FIGS. 4 and 8). Note also that when lower member 80 of holder 76 is pulled to the right (FIG. 7), top surface 94 of top member is lower relative to the bottom of bottom member 80. That is, distance B (FIG. 7) is less than distance A (FIG. 6). Pin 102 can only move through slots 22 and 23 if the holder is in the FIG. 7 orientation. Although pin 102 can reach slots 22 and 23 in the FIG. 6 orientation, shoulder 104 of bottom member 80 (FIG. 6) contacts base 13 and prevents further insertion of holder 76. The bottom surface of both top member 78 and bottom member 80 are flush with each other in FIG. 7, however, so that shoulder 104 does not intersect base 13 of frame 12. Therefore, all insertion and removal of holder 76 from receiving slot 17 takes place with holder 76 in the FIG. 7 orientation.

When the holder is fully inserted into receiving slot 17 such that front surface 95 of top member 78 contacts adjustable stop member 32 (FIG. 3), pin 102 is at the end of horizontal portion 25 of slots 22 and 23 where it turns upward to vertical portion 26. When holder 76 is fully inserted but in its lower position as in FIGS. 3 and 8, substrate 97 is spaced from pin 49 and wedges 63 and 64 of launcher 45. Therefore, during insertion the launcher parts do not damage the substrate nor does the substrate damage the launcher parts, especially pin 49. When holder 76 is fully inserted, bottom member 80 is pushed to the left (FIG. 3), side pin 102 moves in vertical portion 26 of guides slots 22 and 23, and top member 78 carrying substrate 97 moves vertically upward to engage wedges 63 and 64 and pin 47. No sliding of the contacts relative to the substrate takes place. Friction between the surfaces of top and bottom members 78 and 80 of holder 76 holds the substrate in the proper position. Vertical portion 26 of slots 22 and 23 prevents the holder from being removed directly from receiving slot 17 without first pulling bottom portion 80 to the right (FIGS. 3, 6 and 7) to lower substrate 98. Thus, when the holder is removed, there is no sliding between the contacts and the substrate.

Recess 96 on holder 76 is sized for a single length substrate. One would typically have separate holders for accommodating substrates of different sizes. Substrate 97 (FIG. 9) has a central, narrow, etched transmission line conductor 98 and outer, wide etched grounding regions 99 on both sides of transmission line conductor 98. Each time holder 76 is inserted into receiving slot 17, the holder must move substrate 97 to a proper position such that both pins 49 of launchers 45 contact only central transmission line contact 98, and flat surfaces 66 and 67 of wedge members 63 and 64 of both coplanar's sleeves 57 must contact only both sides of outer, grounding contacts 99 (FIG. 9). During the initial alignment, threaded stop member 32 can be rotated to make small changes in the horizontal position of substrate 97 relative to the launchers 45.

The sliding holder loading provides fail-safe insertion that cannot damage the substrate or the contacts, especially pin 47. Insertion and removal take place very quickly, and the contacts, namely wedges 63 and 64 and pin 47 contact the substrate in the same location each time for repeatability of measurement.

Figures 1, 2:
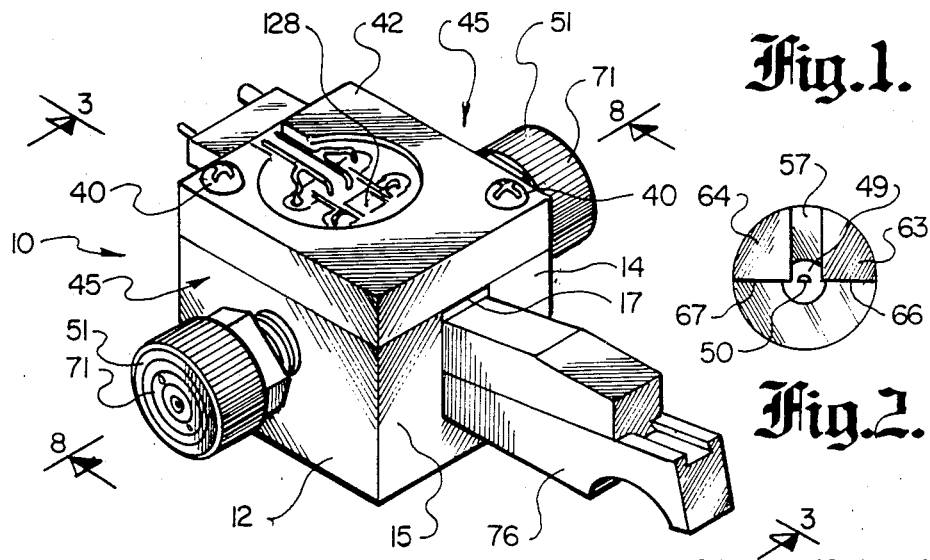

4. The Bias Block. As previously discussed, screws 40 fasten bias block 42 to the top of main frame 12 over receiving slot 17 (FIG. 1, 3 and 8). Bias block 42 is formed of hard thermoplastic material. Four pin-like contacts 108-111 extend downward through bias block 42 such that when the bias block is properly mounted, contacts 108-111 reach to the top surface of substrate 97 when holder 76 is properly inserted into receiving slot 17 (See phantom substrate 97 in FIG. 8). Contacts 108-111 are RF bypassed DC source inputs for biasing active circuit elements. Contacts 108-111 connect by rigid electrical connectors 113-116, which in turn extend into electricl connector 118 (FIGS. 10 and 11) attached to the side of bias block 42. Connectors 113-116 may be encapsulated in a resin or other plastic material to keep the connectors in place. Connectors 113-116 are attached to RF filters on pins 120-123. Pins 120 and 121 also extend through bias block 42 and are spaced from and surrounded by ground 125, and pins 122 and 123 extend to but are insulated from ground strip 126 (FIG. 8). Grounds 125 and 126 contact ground planes 34 and 35 on top of side walls 14 and 15 to provide a path for ground.

A central hole 128 (FIGS. 1, 3, and 10) may also be provided for access to the substrate during testing. The present invention does not have to mount substrate 97 within an enclosed holder. Therefore, by providing an access hole 128 through the top of bias block 42, one can have access to the substrate during electrical testing of it.

The test apparatus of the present invention is then connected to a network analyzer for testing active or passive devices. The test fixture can use any coaxial forms such as APC 7, SMA, 3.5 mm or K connectors depending on the needs of the test facility. Various modifications and changes may be made in the configuration described above that come within the spirit of this invention. The invention embraces all such changes and modifications coming within the scope of the appended claims.

I claim:

1. A test apparatus for making electrical contact with a generally flat substrate, the substrate having edges and upper surface comprising:
   (a) fixture means having upstanding side walls and receiving slot means for receiving a substrate holder with a substrate mounted on the substrate holder inserted such that the substrate holder moves in the receiving slot means generally parallel to the side walls and with opposite edges of the substrate being generally parallel to the side walls;
   (b) launcher means through each side wall in the fixture means and extending into the receiving slot means for making electrical contact at a center location and two outside locations on the edges of substrate; and
   (c) launcher mounting means in the fixture means for mounting at least a portion of the launcher means for rotation about an axis parallel to the plane of the substrate.

2. The test apparatus of claim 1 further comprising guide means in the receiving slot means for receiving a portion of the substrate holder to direct the substrate holder such that movement in and out of the receiving slot means by the holder is out of contact with the launcher means.

3. The test apparatus of claim 2 wherein the guide means comprises a guide slot for permitting movement of the substrate holder into the receiving slot means until the substrate holder is at the end of the receiving slot and permitting movement toward and away from the launcher means when the substrate holder is fully inserted in the receiving slot means.

4. The test apparatus of claim 1 wherein the substrate holder has top and bottom members mounted for sliding relative to each other on mating, inclined surfaces whereby movement of the bottom member relative to the top member changes the position of the substrate within the receiving slot means.

5. The test apparatus of claim 1 wherein the launcher means comprises a central pin, a coplanar sleeve mounted around the pin and means for mounting the coplanar sleeve out of contact with the pin for rotation about the pin.

6. The test apparatus of claim 5 wherein the coplanar sleeve has a pair of wedges extending into the receiving slot means, each wedge having a bottom surface generally aligned with the pin for contacting the substrate.

7. The test apparatus of claim 1 further comprising a bias block means over the fixture means and having electrical contacts extending into the receiving slot means for making contact with the substrate when the substrate is in electrical contact with the launcher means.

8. The test apparatus of claim 7 further comprising a hole extending through the bias block means above the position of the substrate when the substrate holder is fully inserted into the receiving slot means for allowing access to the substrate.

9. The test apparatus of claim 7 further comprising grounding plane means on the fixture means above the launcher means, grounding elements on the bias block in contact with the ground plane means.

* * * * *